United States Patent [19]
Woolf et al.

[11] Patent Number: 5,660,541
[45] Date of Patent: Aug. 26, 1997

[54] METHOD FOR HEAT TREATING LONG LENGTHS OF SILVER CLAD HIGH TEMPERATURE SUPERCONDUCTOR

[75] Inventors: Lawrence D. Woolf, Carlsbad; Robert A. Olstad, San Diego, both of Calif.

[73] Assignee: General Atomics, San Diego, Calif.

[21] Appl. No.: 322,705

[22] Filed: Oct. 13, 1994

[51] Int. Cl.⁶ .................................................. F26B 13/00
[52] U.S. Cl. ..................... 432/8; 34/104; 34/442
[58] Field of Search .......................... 34/104, 442, 385; 432/8, 59

[56] References Cited

U.S. PATENT DOCUMENTS

| | | |
|---|---|---|
| 4,108,737 | 8/1978 | Ehrhardt et al. . |
| 4,126,523 | 11/1978 | Wong . |
| 4,161,062 | 7/1979 | Agatsuma et al. . |
| 4,407,062 | 10/1983 | Sutcliffe et al. . |
| 4,652,697 | 3/1987 | Ando et al. . |
| 4,968,663 | 11/1990 | Whang . |
| 4,973,574 | 11/1990 | Nishio et al. . |
| 4,975,416 | 12/1990 | Onishi et al. . |
| 4,988,673 | 1/1991 | Ferrando . |
| 4,994,437 | 2/1991 | Torii et al. . |
| 5,091,362 | 2/1992 | Ferrando . |
| 5,104,849 | 4/1992 | Shiga et al. . |
| 5,108,982 | 4/1992 | Woolf et al. . |
| 5,118,663 | 6/1992 | Woolf et al. . |
| 5,149,681 | 9/1992 | Ohkawa et al. . |
| 5,200,391 | 4/1993 | Fisher et al. . |

FOREIGN PATENT DOCUMENTS 26 02 729  1/1976  Germany .

OTHER PUBLICATIONS

*Ceramic Superconductors II*, Man F. Yan, The American Ceramic Society, Inc., 1988.

*Structural and Superconducting Properties of $YBa_2Cu_3O_{7-\delta}$ Formed Under Oxygen Pressure Control*, Ienari Iguchi, Akimitsu Sugishita, Manabu Yanagisawa, Shinji Hosaka, Yasuharu Yokoyama and Hajime Asano, Institute of Materials Science, vol. 27, No. 6, Jun., 1988.

*Partial Melt Growth Process of $Bi_2Sr_2Ca_1O_x$ Textured Tapes on Silver*, Jun-ichiro Kase, Kazumasa Togano, Hiroaki Kumakura, Daniel R. Dietderich, Naoshi Irisawa, Takeshi Morimoto and Hiroshi Maeda, Research Center, Ashai Glass Co. Ltd.

*Primary Examiner*—Henry A. Bennett
*Assistant Examiner*—Dinnatia Doster
*Attorney, Agent, or Firm*—Nydegger & Associates

[57] ABSTRACT

A system and method for supporting a superconductor tape during a heat treating process includes a cylindrical spool which is longitudinally split into a first half and a second half. Clamps are provided to hold the halves of the spool together in a first configuration. Additionally, shims are provided which can be positioned between the halves and which, in cooperation with the clamps, hold the halves of the spool in a second configuration. Before the heating process, the superconductor tape is wound onto the spool while it is being held by the clamps in its first configuration. The clamps are then released and the superconductor tape is subjected to the heating process. After the heating process, the shims are positioned between the halves, and the clamps are reengaged to form the spool in its second configuration. The superconductor tape can then be removed from the spool.

15 Claims, 1 Drawing Sheet

METHOD FOR HEAT TREATING LONG LENGTHS OF SILVER CLAD HIGH TEMPERATURE SUPERCONDUCTOR

FIELD OF THE INVENTION

The present invention pertains generally to systems and methods for heat treating superconductor material during the manufacture of a superconductor tape. More particularly, the present invention pertains to systems and structures for supporting the superconductor during the heat treating process. The present invention is particularly, but not exclusively, useful for compensating for dimensional changes of superconductor material that occur during the heat treating process.

BACKGROUND OF THE INVENTION

As is well known, the process of manufacturing a superconductor tape requires that the tape be subjected to a heat treating process which sinters the superconductor material. This heat treating process, however, does more than just sinter the superconductor material. For one, the superconductor tape typically elongates as the superconductor material is sintered. For another, if the superconductor material is covered with a silver cladding, as is typically done for purposes of processing the superconductor material, the silver will tend to bond to adjacent layers in physical contact with one another during a heat treating process.

In order to effectively heat process long lengths of superconductor tape, it is necessary to heat process all of the superconductor tape at the same time. This requires that the entire superconductor tape be somehow configured and supported so that all of the tape can be inserted into an oven for sintering at the same time. The most practical configuration for doing this is accomplished by spooling the tape, however, this causes some problems.

When spooled, portions of the superconductor tape will necessarily come into contact with other portions of the tape. Under room temperature conditions this does not cause any particular problems. However, as indicted above, during a heat treating process, the silver cladding of superconductor tapes which are in physical contact with each other will diffusion bond together. Obviously, this is a very undesirable consequence as it effectively prevents the tape from being unspooled.

As indicated above, it also happens during a heat treating process that the superconductor tape will elongate. If the superconductor tape is spooled, this means the tape will sag at the bottom due to gravity during the heat treating process. Additionally, if there is any friction between overlapping portions of the superconductor tape or between the tape and the spool, during the heat treating process, unwanted kinking of the tape can occur. Like the problems caused by silver cladding diffusion bonding, any sagging or kinking of a superconductor tape during a heat treating process increases the difficulties in unspooling the superconductor tape after the heat treating process has been completed and degrades the superconducting properties of the tape.

In light of the above, it is an object of the present invention to provide a system and method for supporting a superconductor tape which prevents a bonding of the superconductor tape during a heat treating process for sintering the superconductor material. It is another object of the present invention to provide a system and method for supporting a superconductor tape which accommodates dimensional changes caused by elongation of the tape during a heat treating process. Still another object of the present invention is to provide a system and method for supporting a superconductor tape which minimizes any kinking of the superconductor tape during a heat treating process. Yet another object of the present invention is to provide a system and method for supporting a superconductor tape during a heat treating process which is simple to use, easy to manufacture and relatively cost effective.

SUMMARY OF A PREFERRED EMBODIMENT OF THE INVENTION

A system for supporting a superconductor tape during a heat treating process to sinter the superconductor material includes a cylindrical spool. The spool defines a longitudinal axis, and the spool is split along a plane which includes the longitudinal axis to divide the spool into a first half and a second half.

A plurality of releasable clamps are provided to hold the first and second halves of the spool together in either a first configuration or a second configuration. In the first configuration, the first and second halves of the spool are juxtaposed and held by the clamps in a rigid structure. In the second configuration, the first and second halves of the spool are separated from each other. Further, for the second configuration, shims are insertable between the first and second halves to keep the halves separated as the clamps hold the shims and the halves in a rigid structure.

In the operation of the present invention, a long superconductor tape having a silver cladding is coated with a magnesium oxide paint. The superconductor tape is then wound onto the spool while the spool is held by the clamps in its first configuration. After the superconductor tape has been wound onto the spool, the clamps are released to free the first half of the spool from the second half. The spooled superconductor tape is then subjected to a heat treating process which sinters the superconductor material of the tape.

After the heat treating process has been completed, shims are positioned between the first half and the second half of the spool, which are now separated from each other due to elongation of the superconductor tape during sintering. The clamps are then reengaged with the first and the second halves to hold the spool in its second configuration. The superconductor tape may then be removed from the spool, while the spool is held in its second configuration.

BRIEF DESCRIPTION OF THE DRAWINGS

The novel features of this invention, as well as the invention itself, both as to its structure and its operation will be best understood from the accompanying drawings, taken in conjunction with the accompanying description, in which similar reference characters refer to similar parts, and in which.

DESCRIPTION OF THE PREFERRED EMBODIMENTS

Figure 1:
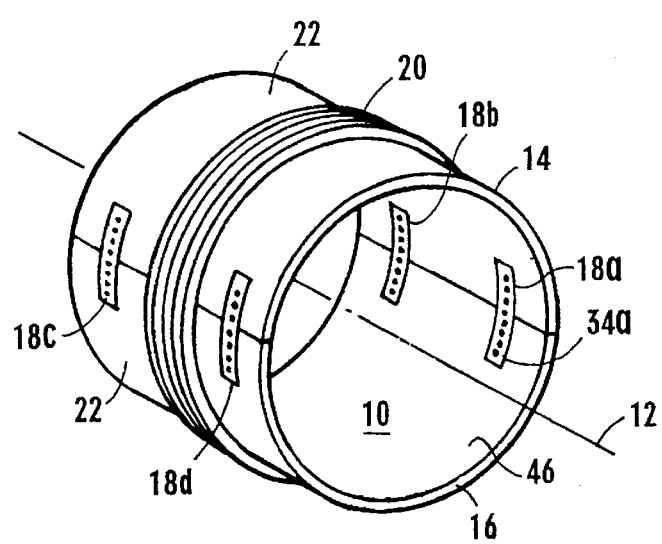
FIG. 1 is a perspective view of the spool system of the present invention with a superconductor tape wound thereon for subsequent heat treatment.

Referring initially to FIG. 1, a spool for use with the system and method of the present invention is shown and generally designated 10. As shown, the spool 10 is a generally hollow cylindrical structure which defines a longitudinal axis 12 that extends through the center of the cylinder. FIG. 1 also shows that the spool 10 is split into a first, or upper, half 14 and a second, or lower, half 16. More specifically, the spool 10 is split into a first half 14 and a second half 16 along a plane which includes the longitudinal axis 12. Preferably, the spool 10 is made of an alumina fiberboard, or a similar material, which is resistive to the very high temperatures used during the heat processing, will not chemically contaminate the superconductor tape and light weight so that it will not break the tape where spool 16 rests on it. Further, for purposes of the present invention, the diameter of spool 10 is approximately equal to twelve inches (12 in.). Further, the surfaces of each half 14 and 16 can be covered by a relatively smooth layer of heat resistant material such as a ceramic fabric. One such material is Nextel fabric.

FIG. 1 also shows that the first half 14 and second half 16 of spool 10 are held together in juxtaposition by a plurality of clamps 18a–d. For purposes of the present invention, the spool 10 as shown in FIG. 1 with its halves 14 and 16 held together by the clamps 18a–d is in its first configuration. Note that each of clamps 18a–d is a pair of clamps, one on the inside and one on the outside surface of the spool.

With spool 10 in its first configuration, as shown in FIG. 1, a superconductor tape 20 can be spooled or wound onto the outer surface 22 of the spool 10. As contemplated by the present invention, the superconductor material of tape 20 can be of any type of superconductor material known in the pertinent art. Preferably, it consists of the well known Bi Pb 2223 composition, nominally $Bi_{1.8}Pb_{0.4}Sr_2Ca_2Cu_3O_x$. Further, in a manner well known in the pertinent art the superconductor material of tape 20 is protected by a silver (Ag) cladding which surrounds the superconductor material.

Figure 2:
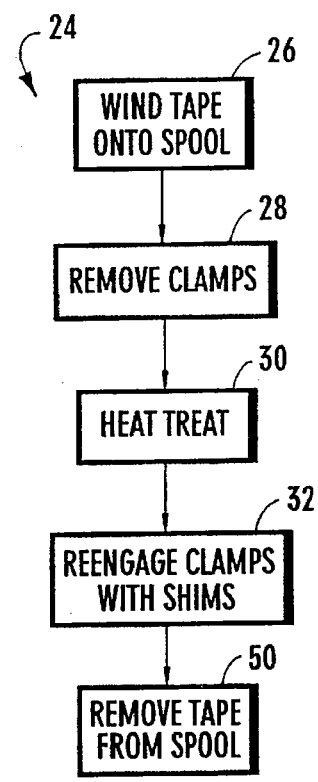
FIG. 2 is a block diagram of the steps in the method for supporting a superconductor tape with a reconfigurable spool according to the present invention.

Referring now to FIG. 2, a block diagram of the method of the present invention is shown and generally designated 24. As indicated in diagram 24, block 26 indicates that the first step in the method of the present invention is to wind a superconductor tape 20 onto the outer surface 22 of spool 10. It is preferable, however, that even before superconductor tape 20 is wound onto the spool 10, the silver cladding surface of tape 20 is painted with a layer of magnesium oxide (MgO). One purpose for this deposited layer of MgO is to provide a separation barrier between juxtaposed portions of the silver cladding of superconductor tape 20. Otherwise these portions that would come into direct contact with each other when the tape 20 is wound onto the spool 10 would subsequently be likely to bond together during the heat treating process. Another purpose for the layer of MgO is to reduce friction between the overlapping portions of superconductor tape 20 and between the tape 20 and outer surface 22 of spool 10. The MgO allows the tapes to slide over one another and over the spool surface as they elongate during the heat treating process. Thus, the possibility of kinking in the superconductor tape 20 due to friction during elongation of the tape during the heat treating process is reduced. After the layer of MgO is deposited on the tape 20, but still before the tape 20 is actually wound onto the spool 10, the MgO layer on tape 20 is heated to approximately one hundred degrees Centigrade (100° C.) to dry off the solvent. The residue of MgO grains and small amount of binder are thus left on the tape 20 to establish the barrier mentioned above. Instead of MgO coating the superconductor tape, layers of non-reactive material, such as Nextel cloth, may be MgO coated using MgO paint and inserted between overlapping layers of superconductor tape. The Nextel cloth must, of course, be split in a manner similar to that of the spool to allow for the free elongation of the superconductor tape during heat treatment. A layer of Nextel cloth between the spool and the first layer of superconductor tape must also be MgO coated.

Block 28 of diagram 24 indicates that after all of the superconductor tape 20 has been spooled or wound onto the outer surface 22 of spool 10, the clamps 18a–d are removed. Block 30 of diagram 24 indicates that the next step in the method of the present invention is to heat treat the superconductor tape 20. The actual sequence of events for heat treating the superconductor material of tape 20 is a fairly well known procedure. First, the spool 10 and the superconductor tape 20 which has been wound thereon are placed into an oven (not shown) where the upper half 14 of spool 10 is placed to rest on the support member 31. It should be noted that, as the heat treating process begins, spool 10 is still in its first configuration. Now that the clamps 18a–d have been removed, this first configuration is maintained by the action of the tape 20 itself. The superconductor tape 20 is then held in the oven (not shown) at a temperature of approximately eight hundred and thirty five degrees Centigrade for approximately one hundred hours (835° C./100 hrs). During the heat treating process, only the top half 14 of spool 10 is supported so that the bottom half 16 is free to move vertically downward as the tape 20 elongates. During this time the superconductor material of the tape 20 is sintered. It happens that although the binder in the MgO layer is driven off during the heat treating process, the MgO particles remain on the silver cladding and continue to establish the barrier between juxtaposed portions of tape 20. Thus, diffusion bonding of the silver cladding on tape 20 is prevented. It also happens, however, that during sintering of the superconductor material in the heat treating process, the superconductor tape 20 elongates.

Figure 3:
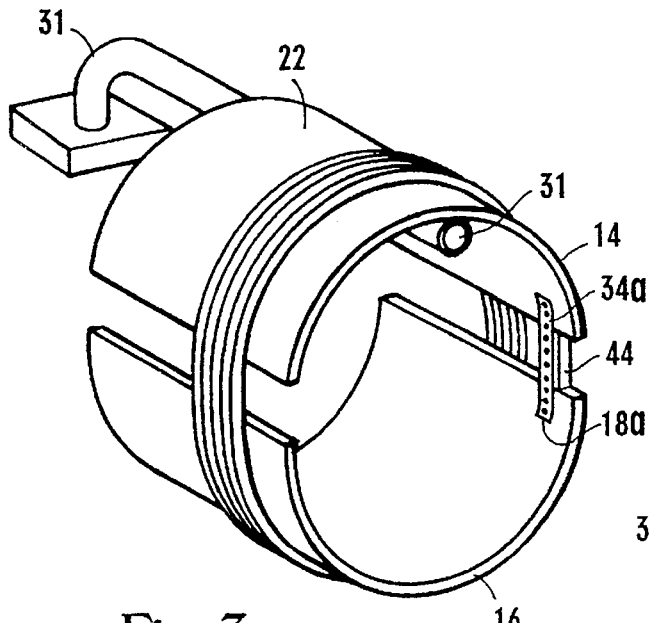
FIG. 3 is a perspective view of the spool system of the present invention with a superconductor tape wound thereon after a heat treatment has sintered the superconductor material in the tape.

Due to the fact the clamps 18a–d were removed from spool 10 prior to the heat treating process (block 30) and because only the top half 14 of spool 10 is supported during the heat treatment, the first half 14 is separable from the second half 16. Consequently, as the superconductor tape 20 elongates during heat treating, the first half 14 of spool 10 is allowed to separate from the second half 16 in order to accommodate the elongation of tape 20. The result is a transformation of spool 10 from a first condition wherein the halves 14 and 16 are juxtaposed (see FIG. 1), to a second condition wherein the halves 14 and 16 have separated from each other (see FIG. 3). Please note that, although the clamp 18a is shown in FIG. 3, none of the clamps 18a–d are attached to spool 10 while it supports tape 20 during the heat treating process. Stated differently, no clamps 18a–d are attached to spool 10 during its transformation from a first configuration into a second configuration.

Once the heat treating process (block 30) has been completed and spool 10, in its second configuration, is removed from the oven (not shown), clamps 18a–d are reengaged with spool 10. This action is indicated in diagram 24 of FIG. 2 by block 32. Just how the clamps 18a–d are engaged and removed from spool 10 will be best appreciated by reference to FIG. 4.

Figure 4:
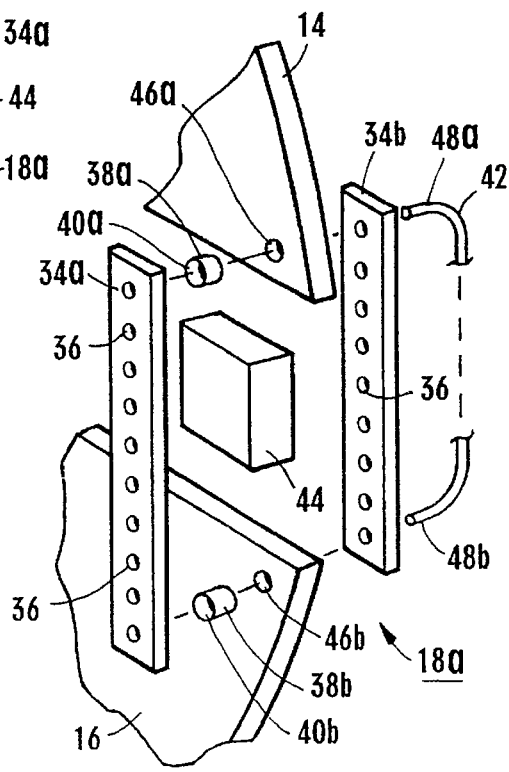
FIG. 4 is an exploded view of a clamp used for the spool system of the present invention with cut away portions of the spool shown for clarity.

In FIG. 4 the clamp 18a is shown to include a pair of strips 34a and 34b. Each one of the strips 34a–b is formed with a plurality of holes 36 which are substantially aligned down the middle of the respective strip 34. As shown, the strips 34a–b are generally rectangular and are relatively thin in comparison with the rectangular dimensions. This thinness of the strips 34 allows them to be somewhat flexible so they can conform with the surface of spool 10. Further, the clamp 18a includes a pair of spacers 38a and 38b which are respectively formed with a hole 40a and 40b. The clamp 18a also includes a wire 42 and a shim 44.

Consider now the engagement and removal of clamp 18a. Initially, clamp 18a is engaged with spool 10 without using the shim 44. This is done before the heat treating process and places spool 10 into its first configuration (see FIG. 1). To do this, the spacer 38a is inserted into a hole 46a which is formed into the first half 14 of spool 10. Likewise, the spacer 38b is inserted into a hole 46b which is formed into the second half 16 of spool 10. Metal spacers 38a and 38b are used so that wire 42 does not dig into and gouge the relatively soft alumina fiberboard material of spool 10. First half 14 and second half 16 are then juxtaposed to place spool 10 into its first configuration (FIG. 1).

Once the halves 14 and 16 are juxtaposed for the first configuration of spool 10, strip 34a is then placed against inner surface 46 of spool 10, and strip 34b is placed against outer surface 22. With these placements, respective holes 36 on strips 34a and 34b are aligned with hole 40a of spacer 38a. Similarly, respective holes 36 on strips 34a and 34b are aligned with hole 40b of spacer 38b. One end 48a of wire 42 is then inserted through holes 36 of strips 34a,b and hole 40a of spacer 38a while the other end 48b of wire 42 is inserted through holes 36 of strips 34a,b and hole 40b of spacer 38b. The ends 48a and 48b are then tied together to hold first half 14 in juxtaposition with second half 16. To remove the clamp 18a, the ends 48a and 48b are untied or cut and the wire 42 is withdrawn from the holes 36, 40a and 40b.

In all important respects, the clamps 18b–d are substantially identical to the structure and cooperation of structure set forth above for the clamp 18a.

As indicated above, once the superconductor tape 20 is wound onto spool 10, the clamps 18a–d are removed. As also indicated above, during the heat treating process the tape 20 elongates and the halves 14 and 16 of spool 10 separate to place spool 10 into its second configuration (see FIG. 3). It is after the heat treating process that shims 44 are incorporated into clamps 18a–d.

To engage the clamps 18a–d, while using shims 44, the shims 44 are first placed between the separated halves 14 and 16, as shown in FIGS. 3 and 4. Specifically, shim 44 is chosen with a proper dimension so that the separation which developed between halves 14 and 16 of spool 10 during the heat treating process is carefully maintained. The clamps 18a–d are then engaged in the manner disclosed above to rigidly hold spool 10 in its second configuration.

Block 50 of diagram 24 in FIG. 2 indicates that after the clamps 18a–d have been reengaged to hold spool 10 in its second configuration, superconductor tape 20 can be removed from the spool 10. It may be, however, that it is desired to retain the superconductor tape 20 on spool 10 for other purposes. This can be done. Note that other types of clamps can be used. Rubber bands, velcro strips and adjustable straps are all contemplated as potential clamps.

While the particular system and method for supporting a superconductor tape during a heat treating process as herein shown and disclosed in detail is fully capable of obtaining the objects and providing the advantages herein before stated, it is to be understood that it is merely illustrative of the presently preferred embodiments of the invention and that no limitations are intended to the details of the construction or design herein shown other than as defined in the appended claims.

We claim:

1. A system for supporting a superconductor tape during a heat treating process which comprises:

a cylindrical spool defining a longitudinal axis, said spool being split along said axis into a first half and a second half;

means for joining said first half with said second half to form said spool into a first configuration for receiving said superconductor tape thereon prior to said heat treating process, said joining means being releasable to separate said first half from said second half during said heat treating process; and means insertable between said first half and said second half for maintaining said spool in a second configuration to allow removal of said superconductor tape therefrom after said heat treating process.

2. A system as recited in claim 1 wherein said joining means comprises a plurality of clamps selectively engageable with said first half and said second half.

3. A system as recited in claim 1 wherein said insertable maintaining means comprises a plurality of shims.

4. A system as recited in claim 1 wherein said spool is made of alumina fiberboard.

5. A system as recited in claim 1 wherein said first half and said second half is covered with a high temperature ceramic fabric.

6. A system as recited in claim I wherein said material is Bi Pb 2223 ($Bi_{1.8}Pb_{0.4}Sr_2Ca_2Cu_3O_x$).

7. A system which comprises:

means for supporting a superconductor tape during a heat treating process; and means for alternatively holding said supporting means in a first configuration or a second configuration, said holding means being removable from said supporting means to accommodate a dimensional change in said superconductor tape during said heat treating process.

8. A system as recited in claim 7 wherein said means for supporting said superconductor tape is a cylindrical spool defining a longitudinal axis, said spool being split substantially along said axis into a first half and a second half.

9. A system as recited in claim 8 wherein said holding means joins said first half with said second half to form said spool into said first configuration for receiving said superconductor tape thereon prior to said heat treating process.

10. A system as recited in claim 8 wherein said holding means is releasable to separate said first half from said second half during said heat treating process.

11. A system as recited in claim 8 further comprising means insertable between said first half and said second half for maintaining said supporting means in said second configuration to allow removal of said superconductor tape therefrom after said heat treating process.

12. A system as recited in claim 8 wherein said holding means comprises a plurality of clamps selectively engageable with said first half and said second half.

13. A system as recited in claim 11 wherein said insertable means for maintaining said supporting means in said second configuration comprises a plurality of shims.

14. A system as recited in claim 8 wherein said spool is made of alumina fiberboard.

15. A system as recited in claim 12 wherein said first half is formed with at least one hole, said second half is formed with at least one hole, and each said clamp comprises:

a strip formed with a plurality of holes; and a wire, said wire being respectably insertable through said holes in said strip, said first half and said second half to hold said first half relative to said second half.

* * * * *